United States Patent
Heo et al.

[11] Patent Number: 6,034,629
[45] Date of Patent: Mar. 7, 2000

[54] ANALOG-TO-DIGITAL CONVERSION APPARATUS

[75] Inventors: Jung-Kwon Heo, Seoul; Young-Nam Oh, Sungnam, both of Rep. of Korea

[73] Assignee: Samsung Electronics Co., Ltd., Kyungki-do, Rep. of Korea

[21] Appl. No.: 08/931,258

[22] Filed: Sep. 16, 1997

[30] Foreign Application Priority Data

Sep. 16, 1996 [KR] Rep. of Korea ............ 96-40240

[51] Int. Cl.[7] ................................... H03M 3/00
[52] U.S. Cl. ................................ 341/143; 341/155
[58] Field of Search .................... 341/143, 144, 341/155, 118

[56] References Cited

U.S. PATENT DOCUMENTS

| | | | |
|---|---|---|---|
| 5,248,972 | 9/1993 | Karema et al. | 341/143 |
| 5,442,353 | 8/1995 | Jackson | 341/143 |
| 5,585,801 | 12/1996 | Thurston | 341/143 |
| 5,742,246 | 4/1998 | Kuo et al. | 341/143 |
| 5,757,300 | 5/1998 | Koilpillai et al. | 341/143 |

FOREIGN PATENT DOCUMENTS 2 271 896  4/1994  United Kingdom ............ H03M 3/00

OTHER PUBLICATIONS

UK Search Report.

*Primary Examiner*—Brian Young
*Attorney, Agent, or Firm*—Sughrue, Mion, Zinn Macpeak & Seas, PLLC

[57] ABSTRACT

An analog-to-digital (A/D) conversion apparatus using a delta-sigma method performs a magnitude control operation and a filtering operation with respect to a differential signal in a conventional A/D conversion apparatus. The A/D conversion apparatus includes a multiplier for multiplying a differential signal output from a differential circuit, a filter for filtering the differential signal and outputting a filtered data signal, and an adder for adding the signals output from the multiplier and the filter and supplying the added result to a quantizer. The factor used in the multiplier is selected so that the quantization noise generated is smaller than the quantization noise generated in the conventional A/D conversion apparatus. Thus, the A/D conversion apparatus provides a wider bandwidth than the conventional A/D conversion apparatus, since it generates relatively smaller quantization noise with respect to the entire passband. As a result, the A/D conversion apparatus provides good performance appropriate for next-generation audio equipment requiring a higher signal-to-noise ratio. Also, since the A/D conversion apparatus can be realized by modifying the conventional A/D conversion apparatus hardware only slightly, an A/D conversion apparatus having much better performance can be manufactured using substantially the same production process and cost.

21 Claims, 3 Drawing Sheets

ANALOG-TO-DIGITAL CONVERSION APPARATUS

BACKGROUND OF THE INVENTION

The present invention relates to an analog-to-digital (A/D) conversion apparatus, and more particularly, to an A/D conversion apparatus in which quantization noise imposed on a signal is reduced in order to improve the performance of the apparatus.

Various A/D conversion technologies for converting an analog signal into a digital signal and various digital-to-analog (D/A) conversion technologies for converting a digital signal into an analog signal, are under development in the field of analog and digital communication systems. Among them, one technology which is widely used in an audio signal band is a delta-sigma method using an oversampling technique. The delta-sigma method uses a low-pass filter (LPF) having a constant bandwidth to thereby limit the frequency band of an input signal, and oversamples the band-limited signal with a sampling frequency more than a Nyquist frequency. A conventional A/D conversion apparatus using such a delta-sigma method is described below with reference to FIG. 1.

A differentiator 11 obtains a differential signal x-y between an input analog signal x and an analog signal supplied from a D/A converter 16. The differential signal x-y is input to a LPF 12, which has a transfer function expressed as H(f), low-pass-filters the differential signal x-y.

A quantizer 13 uses an oversampling technique which uses a frequency much higher than the Nyquist frequency as a sampling frequency fs, in order to quantize the signal (x-y)H(f), low-pass-filtered by the LPF 12, into a quantization bit of a single bit. The quantizer 13 includes a multiplier 14 and a sampler 15 and quantizes an analog signal to thereby output it in the form of a 1-bit bitstream. The multiplier 14 multiplies the low-pass-filtered data (x-y)H(f) by a predetermined value g. The sampler 15 uses the sampling frequency fs to sample the data (x-y)H(f)g output from the multiplier 14, to thereby generate 1-bit digital data expressed as a 1-bit quantization bit. As a result, the 1-bit digital data y is output from the quantizer 13 in the form of a 1-bit bitstream. The 1-bit digital data y is input to the D/A converter 16. The D/A converter 16, which is a 1-bit digital-to-analog converter, converts the 1-bit bitstream output from the quantizer 13 into an analog signal to then be output to the differentiator 11.

Although the A/D conversion apparatus of FIG. 1 adopts an oversampling technique using as a sampling frequency fs a frequency much higher than the Nyquist frequency, the 1-bit bitstream output from the sampler 15 still contains quantization noise q which is added during the quantization process. For analyzing such quantization noise q, a transfer function of the A/D conversion apparatus of FIG. 1 is expressed by the following equation (1) with respect to the 1-bit digital data y generated by the quantizer 13.

$$y=(x-y)H(f)g+q \quad (1)$$

Equation (1) is expressed as the following equation (2) if equation (1) is arranged with respect to the 1-bit data y.

$$y = H(f)\frac{g}{1+H(f)g}x + \frac{1}{1+H(f)g}q \quad (2)$$

Here, H(f) is a transfer function of the LPF 12.

If H(f)g is sufficiently larger than '1', the quantization noise generated during the quantization process can be expressed by the following equation (3).

$$\frac{1}{1+H(f)g}q \quad (3)$$

The quantization noise expressed by equation (3) is inversely proportional to the transfer function H(f) of the LPF 12. That is, as shown in the graph of FIG. 2, the quantization noise q becomes larger as the frequency grows higher. More particularly, in the case where the factor g of the multiplier 14 is constant, the quantization noise expressed by equation (3) is determined by the transfer function H(f) of LPF 12. Therefore, the higher the frequency, the smaller the magnitude of H(f) to thereby increase the quantization noise.

If H(f) is '1', the quantization noise is minimized, which can be expressed by the following equation (4).

$$\frac{1}{1+g}q \quad (4)$$

However, as the frequency becomes higher, the magnitude of the quantization noise becomes larger, while the magnitude of the signal becomes smaller. As a result, a high frequency signal is stained with the quantization noise which causes a band, through which an input analog signal is converted into a digital signal, to be narrower.

Moreover, audio equipment requiring a sampling frequency higher than the current sampling frequency, for example, a next-generation audio equipment according to a super-audio concept having a maximum bandwidth of about 100 KHz, requires a signal-to-noise ratio (SNR) higher than the current SNR. Therefore, in the case where the above-described A/D conversion apparatus is used in the above-described audio equipment, the quantization noise problem becomes much more severe.

SUMMARY OF THE INVENTION

To solve the above problems, it is an object of the present invention to provide an analog-to-digital (A/D) conversion apparatus in which quantization noise generated at the time when an input analog signal is converted into a digital signal is reduced to thereby improve analog-to-digital conversion performance.

To accomplish the above object of the present invention, there is provided an analog-to-digital (A/D) conversion apparatus comprising:

a differentiator for generating a differential signal between an input analog signal and a predetermined analog signal to be fedback; means for band-pass-filtering the differential signal generated by the differentiator and outputting the filtered data; a first multiplier for multiplying the differential signal generated by the differentiator by a first factor and outputting the resultant data; an adder for adding the signal output from the means for filtering and the signal output from the first multiplier and outputting the resultant data; a D/A converter for digital-to-analog-converting a 1-bit bitstream composed of 1-bit digital data output from a quantizer, and outputting the converted data to the differentiator as a feedback signal; and a quantizer for quantizing the data output from the adder into 1-bit digital data expressed as a 1-bit quantization bit, and outputting a 1-bit bitstream composed of the quantized 1-bit digital data.

The first factor of the first multiplier has a magnitude which satisfies a condition for generating quantization noise relatively smaller than that when the quantizer quantizes only the output data of the means for filtering.

BRIEF DESCRIPTION OF THE DRAWINGS

A preferred embodiment is described with reference to the drawing wherein.

DETAILED DESCRIPTION OF THE PREFERRED EMBODIMENT

A preferred embodiment of the present invention will be described with reference to the accompanying drawings.

Figure 3:
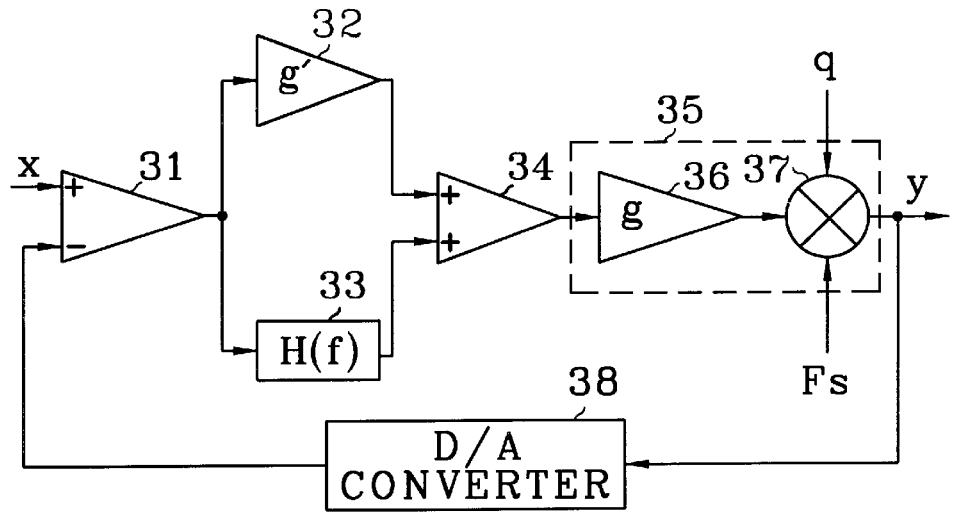
FIG. 3 is a block diagram of an A/D conversion apparatus according to a preferred embodiment of the present invention.

FIG. 3 shows an A/D conversion apparatus according to a preferred embodiment of the present invention. The apparatus of FIG. 3 includes a differentiator 31 which performs the same operation as that of the FIG. 1 differentiator 11, and thereby obtains differential data x-y between an input analog signal x and an analog signal y fedback from a D/A converter 38, and outputs the differential signal x-y to a multiplier 32 and a filter 33. The multiplier 32 multiplies the input differential signal x-y by a predetermined factor g' and outputs the resultant data (x-y)g' to an adder 34. A filter 33, which is implemented either as a low-pass filter (LPF) or a high-pass filter (HPF) having a constant bandwidth expressed as a transfer function H(f), filters the input differential data x-y and generates band-limited data (x-y)H(f). The band-limited data is input to the adder 34.

The adder 34 adds the data (x-y)g' supplied from the multiplier 32 and the band-limited data (x-y)H(f) supplied from the filter 33, and outputs the result to a quantizer 35. The quantizer 35, receiving the data output from the adder 34, includes a multiplier 36 and a sampler 37. The quantizer 35 uses an oversampling technique which uses as a sampling frequency Fs a frequency much higher than the Nyquist frequency, and quantizes the signal supplied from the adder 34 into 1-bit digital data expressed as a 1-bit quantization bit. In more detail, the multiplier 36 multiplies the signal (x-y)g'+(x-y)H(f) output from the adder 34 by a predetermined value g and outputs the multiplication result to the sampler 37. The sampler 37 samples the data [(x-y)g'+(x-y)H(f)]g output from the multiplier 36 using the sampling frequency Fs, and generates 1-bit digital data y. As a result, the 1-bit digital data y is output in the form of a bit bitstream from the quantizer 35. The D/A converter 38 converts the 1-bit bitstream of the 1-bit digital data y received from the quantizer 35 into an analog signal to then be supplied to the differentiator 31 as a feedback signal.

The difference between the A/D conversion apparatuses of FIG. 3 and FIG. 1, will be described below in relation to the quantization noise.

The A/D conversion apparatus of FIG. 3 has a transfer function which is expressed as the following equation (5) with respect to the 1-bit digital data y generated by the quantizer 35.

$$y=((x-y)H(f)+(x-y)g')g+q \tag{5}$$

The above equation (5) is expressed as the following equation (6) if equation (5) is arranged with respect to the 1-bit digital data y.

$$y = \frac{(g' + H(f))g}{1 + (g' + H(f))g} x + \frac{1}{1 + (g' + H(f))g} q \tag{6}$$

Here, H(f) is a transfer function of the filter 33.

If (g'+H(f))g is sufficiently larger than '1', the quantization noise generated during quantization can be expressed as the following equation (7).

$$\frac{1}{1 + (g' + H(f))g} q \tag{7}$$

Figure 4A:
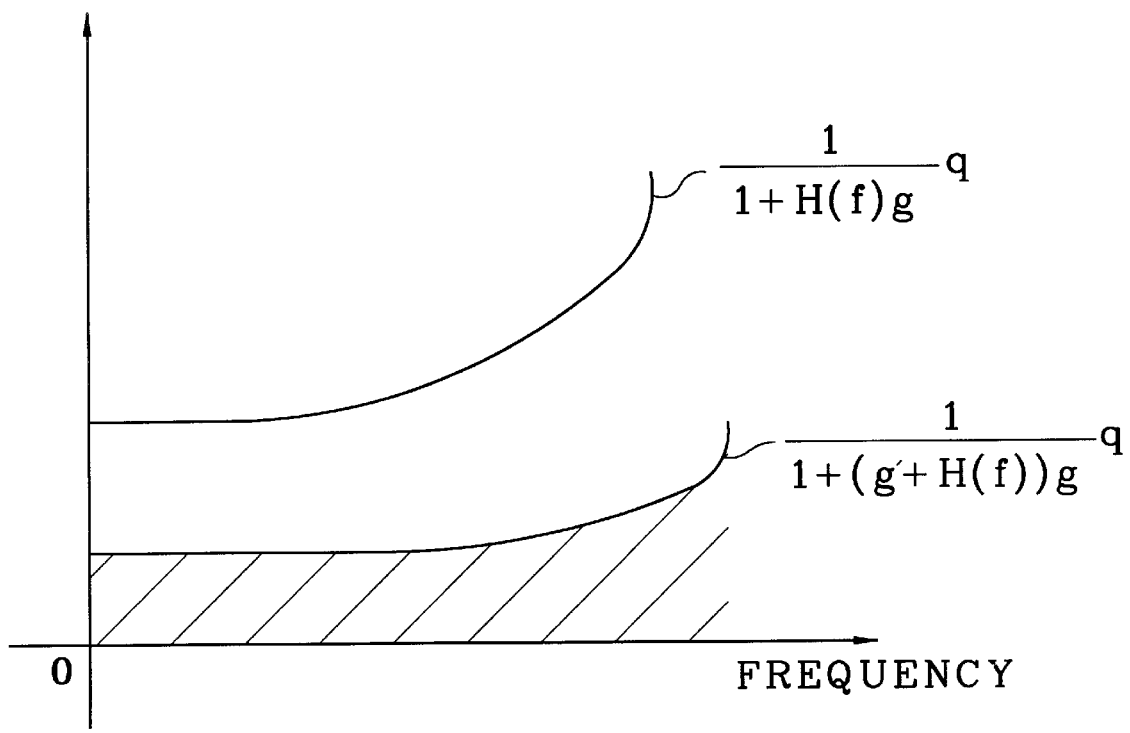
FIG. 4A is a graphical view showing a characteristic curve of frequency versus quantization noise when the filter of the FIG. 3 apparatus is a low-pass filter.
Figure 4:
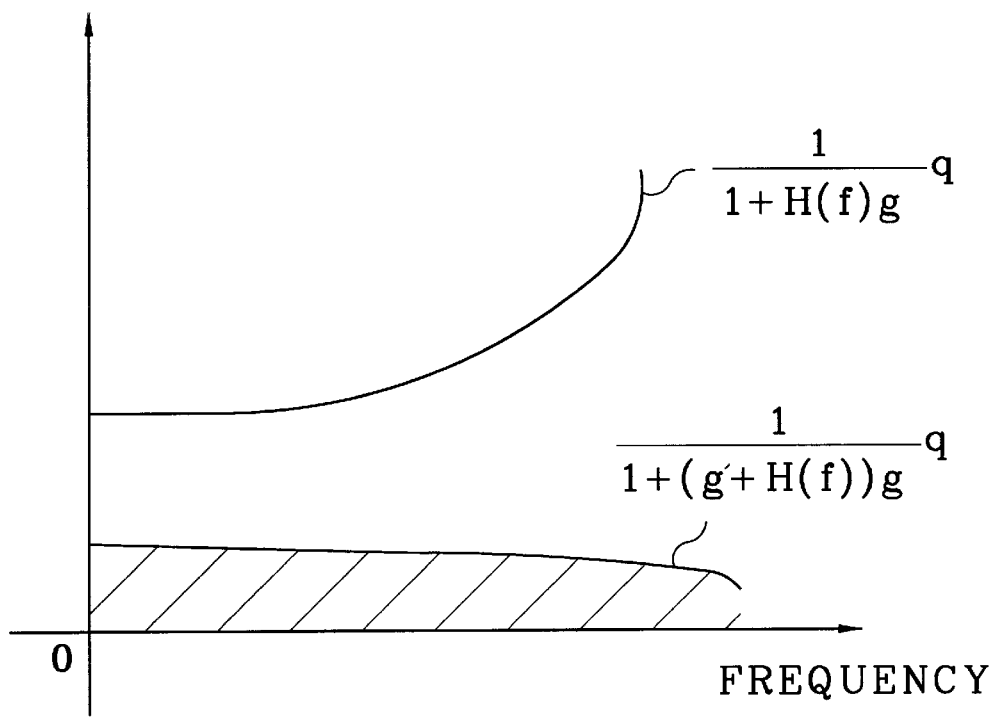
FIG. 4B is a graphical view showing a characteristic curve of frequency versus quantization noise when the filter of the FIG. 3 apparatus is a high-pass filter.

When the filter 33 is a LPF, the quantization noise expressed by equation (7) satisfies the frequency-quantization noise characteristic curve shown at the relatively lower side of FIG. 4A, i.e., below the curve for equation (3) shown in FIG. 4. If a transfer function H(f) of the filter 33 and the factor g' of the multiplier 32 are '1', respectively, the quantization noise of equation (7) is minimized, which can be expressed as the following equation (8).

$$\frac{1}{1 + 2g} q \tag{8}$$

Figure 1:
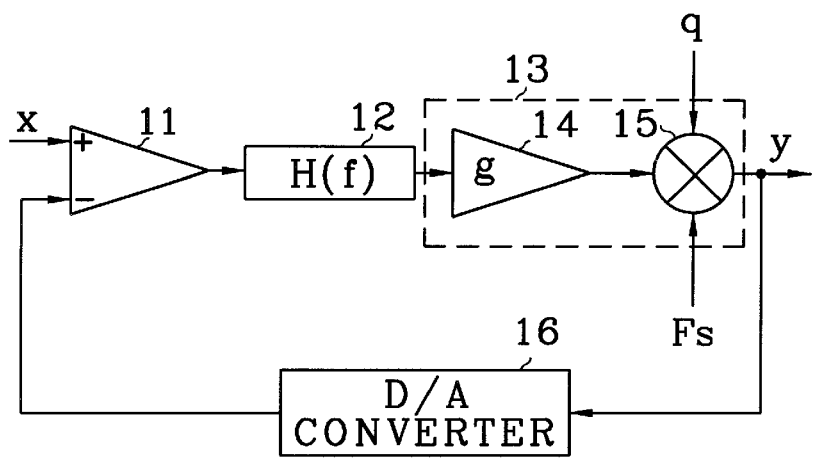
FIG. 1 is a block diagram of a conventional A/D conversion apparatus.
Figure 2:
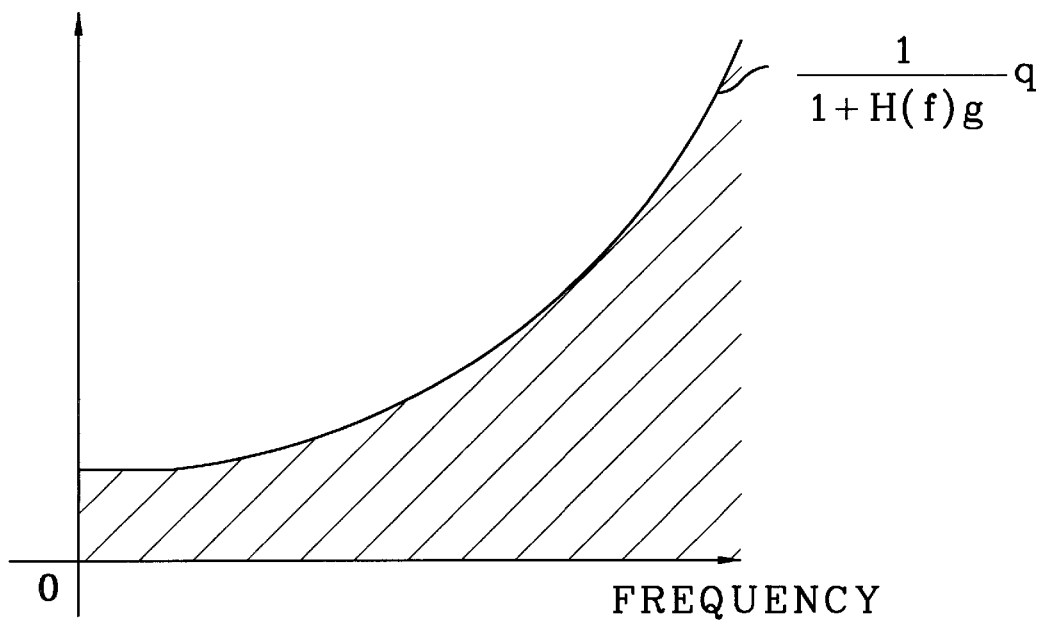
FIG. 2 is a graphical view showing a characteristic curve of frequency versus quantization noise in the apparatus shown in FIG. 1.

Thus, the apparatus of FIG. 3 has relatively smaller quantization noise in comparison with the A/D conversion apparatus of FIG. 1 using the LPF having the same transfer function H(f). In FIG. 4A, the frequency-quantization noise characteristic curve, which is shown at the relatively upper part of the graph, is a characteristic curve of the conventional apparatus shown in FIG. 1. If the factor g' of the multiplier 32 becomes larger than '1', the quantization noise becomes much smaller. In addition, since an increasing rate of the quantization noise is lower than that for the conventional FIG. 1 apparatus, a passband having small quantization noise can be determined more widely than in the conventional case.

When the filter 33 is a HPF, the quantization noise satisfies the frequency-quantization noise characteristic curve shown at the relatively lower part of the graph of FIG. 4B. Accordingly, the apparatus of FIG. 3 has a relatively smaller quantization noise compared to the A/D conversion apparatus of FIG. 1. That is, as the input signal band extends into the high frequency region, the transfer function H(f) of filter 33 increases and thus, the quantization noise becomes smaller. Also, when both factors g' and g of the multipliers 32 and 36 are constant, the quantization noise is determined based on the transfer function H(f) of filter 33. Therefore, as the frequency becomes higher, the magnitude of H(f) becomes larger and thus, the quantization noise is reduced. If a transfer function H(f) of filter 33 has the minimum value '0' and the factor g' of the multiplier 32 is '1', the quantization noise is maximized and expressed the same as in equation (4), which is the same as the minimum of the quantization noise of the A/D conversion apparatus of FIG.

1. Also, if the factor g' of the multiplier 32 becomes larger than '1', the quantization noise can be expressed by the following equation (9), which becomes much smaller.

$$\frac{1}{1+g'g}q \qquad (9)$$

Thus, the apparatus of FIG. 3, using the HPF, has smaller quantization noise compared to the D/A conversion apparatus of FIG. 1, over the entire frequency domain, as shown in FIG. 4B.

As described above, the A/D conversion apparatus according to the present invention performs a filtering operation using an LPF or HPF and a magnitude control operation separately with respect to differential data between both adjacent analog signals, and adds the magnitude-controlled data and the filtered data to quantize the added result. Thus, the present invention can reduce quantization noise with respect to the entire frequency domain and has the effect of widening the passband. As a result, the present invention provides performance appropriate for the next-generation of audio equipment requiring a higher SNR. Also, since the A/D conversion apparatus according to the present invention can be realized by only slightly modifying the hardware of the conventional A/D conversion apparatus, an A/D conversion apparatus having much better performance can be manufactured using substantially the same production process and at substantially the same cost.

While only certain embodiments of the invention have been specifically described herein, it will be apparent that numerous modifications may be made thereto without departing from the spirit and scope of the invention.

What is claimed is:

1. An analog-to-digital (A/D) conversion apparatus comprising:
    a differential circuit for generating a differential signal between an input analog signal and an analog feedback signal;
    means for filtering said differential signal generated by said differential circuit and outputting filtered data;
    a first multiplier for multiplying said differential signal generated by said differential circuit by a first factor and outputting a first multiplied signal;
    an adder for adding the signal output from said means for filtering and the signal output from said first multiplier and outputting a sum signal;
    a quantizer for quantizing said sum signal into 1-bit digital data expressed as a 1-bit quantization bit, and outputting a bitstream including the quantized 1-bit digital data; and
    a digital-to-analog (D/A) convertor for converting the bitstream including the 1-bit digital data output from said quantizer, and outputting the converted data to said differential circuit as the analog feedback signal,
    wherein said first factor of said first multiplier has a magnitude satisfying a condition for generating quantization noise relatively smaller than quantization noise generated when the quantizer quantizes only the signal output from the means for filtering.

2. The A/D conversion apparatus according to claim 1, wherein said quantizer comprises:
    a second multiplier for multiplying said sum signal output from said adder by a second factor and outputting a resultant signal; and
    a sampler for oversampling said resultant signal and generating a 1-bit digital data,
    wherein said first multiplier, said second multiplier and said means for filtering operate so that the quantization noise introduced by said quantizer satisfies the following equation:

$$\text{quantization noise} = \frac{1}{1+(g'+H(f))g}q$$

in which (g'+H(f))g is sufficiently larger than '1',
    wherein g' is the first factor, g is the second factor and H(f) is a transfer function of said means for filtering.

3. The A/D conversion apparatus according to claim 2, wherein said means for filtering is a low-pass filter and said first factor has a magnitude of at least '1'.

4. The A/D conversion apparatus according to claim 3, wherein the transfer function H(f) of said means for filtering has a maximum value of '1' and the first factor of said first multiplier has a minimum value of '1', thereby limiting the minimized magnitude of the introduced quantization noise to $$\frac{1}{1+2g}q.$$

5. The A/D conversion apparatus according to claim 2, wherein said means for filtering is a high-pass filter and said first factor has a magnitude of at least '1'.

6. The A/D conversion apparatus according to claim 5, wherein the transfer function H(f) of said means for filtering has a minimum value of '0' and the first factor of the first multiplier has a minimum value of '1', thereby limiting the maximized magnitude of the introduced quantization noise to $$\frac{1}{1+g}q.$$

7. An analog-to-digital (A/D) conversion apparatus comprising:
    a differential circuit for generating a differential signal between an input analog signal and an analog feedback signal;
    a filter for filtering the differential signal generated by said differential circuit and outputting a filtered signal;
    a first multiplier for multiplying the differential signal by a first factor and outputting a first multiplied signal;
    an adder for adding said filtered signal and said first multiplied signal and outputting a sum signal;
    a quantizer for quantizing said sum signal into 1-bit digital data expressed as a 1-bit quantization bit, and outputting a bitstream including the quantized 1-bit digital data; and
    a digital-to-analog (D/A) converter for converting the bitstream and outputting the converted data as the analog feedback signal,
    wherein said first factor has a magnitude satisfying a condition for generating quantization noise relatively smaller than quantization noise generated when the quantizer quantizes only the signal output from the filter.

8. The A/D conversion apparatus according to claim 7, wherein said quantizer comprising:
    a second multiplier for multiplying the sum signal by a second factor and outputting a second multiplied signal; and a sampler for oversampling the second multiplied signal and generating the 1-bit digital data, wherein said first multiplier, said second multiplier and said filter operate so that the quantization noise introduced by the said quantizer satisfies the following equation:

$$\text{quantization noise} = \frac{1}{1 + (g' + H(f))g}q$$

in which (g'+H(f))g is sufficiently larger than '1', wherein g' is the first factor, g is the second factor and H(f) is a transfer function of said filter.

9. The A/D conversion apparatus according to claim 8, wherein said filter is a low-pass filter and said first factor has a magnitude of at least '1'.

10. The A/D conversion apparatus according to claim 9, wherein the transfer function H(f) has a maximum value of '1' and the first factor has a minimum value of '1', thereby limiting the minimized magnitude of the introduced quantization noise to $$\frac{1}{1+2g}q.$$

11. The A/D conversion apparatus according to claim 8, wherein said filter is a high-pass filter and said first factor has a magnitude of at least '1'.

12. The A/D conversion apparatus according to claim 11, wherein the transfer function H(f) has a minimum value of '0' and the first factor has a minimum value of '1', thereby limiting the maximized magnitude of the introduced quantization noise to $$\frac{1}{1+g}q.$$

13. A method of converting a signal, comprising:

computing the difference between an input analog signal and an analog feedback signal thereby generating a differential signal;

filtering said differential signal thereby generating filtered data;

multiplying said differential signal by a first factor thereby generating a first multiplied signal;

adding said filtered data signal and said first multiplied signal thereby generating a sum signal;

quantizing said sum signal into 1-bit digital data expressed as a 1-bit quantization bit, and outputting a bitstream including the quantized 1-bit digital data; and converting the bitstream including the 1-bit digital data and outputting the converted data as the analog feedback signal, wherein said first factor has a magnitude satisfying a condition for generating quantization noise relatively smaller than quantization noise generated when quantizing only the filtered data signal.

14. The method according to claim 13, wherein said quantizing introduces quantization noise, and said quantizing comprising:

multiplying the sum signal by a second factor and outputting a second multiplied signal; and oversampling the second multiplied signal and thereby generating the 1-bit digital data, wherein said multiplying the differential signal by a first factor, said multiplying the sum signal by a second factor and said filtering operate so that the quantization noise introduced by the said quantizing satisfies the following equation:

$$\text{quantization noise} = \frac{1}{1 + (g' + H(f))g}q$$

in which (g'+H(f))g is sufficiently larger than '1', wherein g' is the first factor, g is the second factor and H(f) is a transfer function for said filtering.

15. The method according to claim 14, wherein said filtering is a low-pass filtering and said first factor has a magnitude of at least '1'.

16. The method according to claim 15, wherein the transfer function H(f) has a maximum value of '1' and the first factor has a minimum value of '1', thereby limiting the minimized magnitude of the introduced quantization noise to $$\frac{1}{1+2g}q.$$

17. The method according to claim 14, wherein said filtering is a high-pass filtering and said first factor has a magnitude of at least '1'.

18. The method according to claim 17, wherein the transfer function H(f) has a minimum value of '0' and the first factor has a minimum value of '1', thereby limiting the maximized magnitude of the introduced quantization noise to $$\frac{1}{1+g}q.$$

19. An analog-to-digital (A/D) conversion apparatus comprising:

a differential circuit for generating a differential signal between an input analog signal and an analog feedback signal;

means for filtering said differential signal generated by said differential circuit and outputting filtered data;

a first multiplier for multiplying said differential signal generated by said differential circuit by a first factor and outputting a first multiplied signal wherein the input of said first multiplier is directly connected to the output of said differential circuit;

an adder for adding the signal output from said means for filtering and the signal output from said first multiplier and outputting a sum signal;

a quantizer for quantizing said sum signal into 1-bit digital data expressed as a 1-bit quantization bit, and outputting a bitstream including the quantized 1-bit digital data; and a digital-to-analog (D/A) convertor for converting the bitstream including the 1-bit digital data output from said quantizer, and outputting the converted data to said differential circuit as the analog feedback signal.

20. An analog-to-digital (A/D) conversion apparatus comprising:

a differential circuit for generating a differential signal between an input analog signal and an analog feedback signal;

a filter for filtering the differential signal generated by said differential circuit and outputting a filtered signal;

a first multiplier for multiplying the differential signal by a first factor and outputting a first multiplied signal wherein the input of said first multiplier is already connected to the output of said differential circuit;

an adder for adding said filtered signal and said first multiplied signal and outputting a sum signal;

a quantizer for quantizing said sum signal into 1-bit digital data expressed as a 1-bit quantization bit, and outputting a bitstream including the quantized 1-bit digital data; and a digital-to-analog (D/A) converter for converting the bitstream and outputting the converted data as the analog feedback signal.

21. A method of converting a signal, comprising:

computing the difference between an input analog signal and an analog feedback signal thereby generating a differential signal;

filtering said differential signal thereby generating filtered data;

multiplying said differential signal by a first factor thereby generating a first multiplied signal wherein said differential signal is the difference between said input signal and said analog feedback signal;

adding said filtered data signal and said first multiplied signal thereby generating a sum signal;

quantizing said sum signal into 1-bit digital data expressed as a 1-bit quantization bit, and outputting a bitstream including the quantized 1-bit digital data; and converting the bitstream including the 1-bit digital data, and outputting the converted data as the analog feedback signal.

* * * * *